(12) United States Patent
Huang et al.

(10) Patent No.: US 9,660,612 B2
(45) Date of Patent: May 23, 2017

(54) PHASE SHIFTED RESONATOR

(71) Applicant: Nokia Technologies Oy, Espoo (FI)

(72) Inventors: Yu-Ting Huang, Sunnyvale, CA (US); Brecht Francois, Santa Clara, CA (US); Niels Bonne Larsen, Sunnyvale, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/810,270

(22) Filed: Jul. 27, 2015

(65) Prior Publication Data

US 2017/0033761 A1  Feb. 2, 2017

(51) Int. Cl.
| | |
|---|---|
| *H03H 9/66* | (2006.01) |
| *H03H 7/20* | (2006.01) |
| *H03H 7/32* | (2006.01) |
| *H03H 7/01* | (2006.01) |
| *H03H 9/64* | (2006.01) |
| *H03H 7/12* | (2006.01) |
| *H03H 11/20* | (2006.01) |
| *H03H 9/68* | (2006.01) |
| *H03H 11/16* | (2006.01) |

(52) U.S. Cl.
CPC ............ *H03H 9/66* (2013.01); *H03H 7/0115* (2013.01); *H03H 7/12* (2013.01); *H03H 7/20* (2013.01); *H03H 7/325* (2013.01); *H03H 9/64* (2013.01); *H03H 9/68* (2013.01); *H03H 11/16* (2013.01); *H03H 11/20* (2013.01)

(58) Field of Classification Search
CPC . H03H 7/18; H03H 9/66; H03H 11/16; H03H 7/325; H03H 7/0115; H03H 9/64; H03H 7/12; H03H 7/20; H03H 11/20; H03H 9/68

USPC ..... 333/17.1, 17.3, 133, 152, 144, 126, 174, 333/193–196, 187, 188
See application file for complete search history.

(56) References Cited

U.S. PATENT DOCUMENTS

| | | | |
|---|---|---|---|
| 4,132,964 A * | 1/1979 | Wilcox ................. | H03B 5/366 331/116 R |
| 5,874,866 A * | 2/1999 | Satoh .................. | H03H 9/6483 331/107 A |
| 2005/0280476 A1 | 12/2005 | Abe et al. | |

(Continued)

OTHER PUBLICATIONS

Bousbia, L. "RF Phase Shifter Using Coupled Microstrip Square Rings Tunable Bandpass Filter." Global Journal of Researches in Engineering Electrical and Electronics Engineering 12, No. 3, V 1.0 (Mar. 2012).

(Continued)

*Primary Examiner* — Robert Pascal
*Assistant Examiner* — Jorge Salazar, Jr.
(74) *Attorney, Agent, or Firm* — Mintz Levin Cohn Ferris Glovsky and Popeo, P.C.

(57) ABSTRACT

Methods and apparatus, including computer program products, are provided for a tunable filter. In some example embodiments, there may be provided an apparatus. In some example embodiments, there is provided an apparatus. The apparatus may include a tunable radio frequency filter including a tunable phase shifter coupled to a resonator, wherein the tunable phase shifter tunes a center frequency of the tunable radio frequency filter by at least varying a phase of a radio frequency signal provided to the resonator. Related apparatus, systems, methods, and articles are also described.

19 Claims, 10 Drawing Sheets

(56) References Cited

U.S. PATENT DOCUMENTS

| | | | | |
|---|---|---|---|---|
| 2006/0125465 A1* | 6/2006 | Xiang | ................... | B82Y 20/00 |
| | | | | 324/72.5 |
| 2013/0127534 A1* | 5/2013 | Badillo | ................. | H03H 11/22 |
| | | | | 330/254 |
| 2014/0106698 A1 | 4/2014 | Mi et al. | | |
| 2014/0355497 A1 | 12/2014 | Reiha | | |
| 2015/0180439 A1 | 6/2015 | Reiha | | |

OTHER PUBLICATIONS

Kim, Ki-Byoung. "Design of Tunable Band-pass Filters and Phase Shifters Using BST Thin Film." Microwave Conference, 2002. 32nd European. IEEE. (Sep. 2002). pp. 1-4.

Taslimi, A. A Loop Resonator Tunable Filter Using Phase Shifters.) Proceedings of Asia-Pacific Microwave Conference 2010. IEICE. (2010). pp. 686-689.

Taslimi, A. "Phase Shifter Based Tunable Bandpass Filters." Proceedings of the 6th German Microwave Conference. IMA (Mar. 2011).

Hong, Jia-Sheng. "On the Development of Tunable Microwave Devices for Frequency Agile Applications." Piers Online, vol. 4, No. 7. (2008). pp. 726-730.

Hassan, et al. Techniques for Tuning BAW-SMR Resonators for the 4th Generation of Mobile Communications, Modeling and Measurement Methods for Acoustic Waves and for Acoustic Microdevices, Prof. Marco G. Beghi (Ed.), InTech, DOI: 10.5772/55131. (2013) Accessed Aug. 25, 2016 from: http://www.intechopen.com/books/modeling-and-measurement-methods-for-acoustic-waves-and-for-acoustic-microdevices/techniques-for-tuning-baw-smr-resonators-for-the-4th-generation-of-mobile-communications.

\* cited by examiner

PHASE SHIFTED RESONATOR

FIELD

The subject matter disclosed herein relates to filters.

BACKGROUND

As cellular and wireless becomes a more integral part of everyday life, cellular user equipment may be expected to provide more capabilities throughout the world. As a consequence, the user equipment may be expected to operate over a wider portion of the radio frequency (RF) spectrum. Although this may seem like a relatively straightforward function, configuring the user equipment to be able to tune over different portions of the RF spectrum presents new challenges to cellular manufacturers.

SUMMARY

Methods and apparatus, including computer program products, are provided for a tunable filter.

In some example embodiments, there is provided an apparatus. The apparatus may include a tunable radio frequency filter including a tunable phase shifter coupled to a resonator, wherein the tunable phase shifter tunes a center frequency of the tunable radio frequency filter by at least varying a phase of a radio frequency signal provided to the resonator.

In some example embodiments, one of more variations may be made as well as described in the detailed description below and/or as described in the following features. The resonator may include a fixed frequency resonator. The fixed frequency resonator may include at least one fixed capacitor and/or at least one fixed inductor. The fixed frequency resonator may include a surface acoustic wave resonator, a bulk acoustic wave resonator, a film bulk acoustic wave resonator, a ceramic filter, and/or a thin film bulk acoustic wave. The tunable phase shifter may include a pi-type phase shifting circuit, a T-type phase shifting circuit, and/or a transformer-based phase shifting circuit. The tunable phase shifter may vary the phase by varying a tunable inductor, a tunable capacitor, and/or a length of delay line. The tunable phase shifter may be implemented in a first technology. The resonator may be implemented in a second technology. The first technology may include an integrated passive device technology including active circuitry to enable tuning of the tunable phase shifter. The second technology may include surface acoustic wave and/or bulk acoustic wave technology. The tunable radio frequency filter may include a tunable radio frequency bandpass filter, a radio frequency lowpass filter, a radio frequency highpass filter, a radio frequency notch filter, a radio frequency band stop filter, an intermediate filter frequency, a radio frequency front end filter, or any combination thereof. The apparatus may further include a controller configured to at least receive a frequency allocation from a base station, and vary, at the tunable phase shifter, at least a variable capacitor and/or a variable inductor to vary the phase, wherein the varied phase adjusts the center frequency of the tunable radio frequency filter. The tunable phase shifter may include an input and an output, wherein the input receives the radio frequency signal, and wherein the output provides, to the resonator, a phase shifted radio frequency signal causing a change in a resonant frequency of the resonator. The resonator may include an acoustic resonator, wherein the tunable phase shifter includes an inductor implemented in integrated passive technology, and wherein the tunable phase shifter includes at least one variable capacitor including an active switch to vary the capacitance.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

Like labels are used to refer to same or similar items in the drawings.

DETAILED DESCRIPTION

It is expected that radios including user equipment such as cell phones, smart phones, tablets, and/or the like will include an RF front-end that is tunable. These tunable RF front-ends may provide sufficient rejection of unwanted signals, low loss of wanted signals, good power handling, and/or other features as well.

The tunable RF filter may be implemented using for example an RF filter that provides a passband for the wanted signal of interest, and rejects (for example, provides a stopband(s)) for the unwanted signals. For example, in the case of a tunable RF bandpass filter at the transmit side of a transceiver, this filter may allow the wanted signal, such as a transmit signal, to pass to an antenna, while rejecting unwanted signals such as harmonics of the wanted signal and the like that may cause interference to the receiver portion of the transceiver.

Tunable RF filters can include at least one resonant circuit, such as an inductive-capacitive resonance tank circuit. For example, the resonant circuit may include at least one variable element, such as a variable capacitor and/or a variable inductor, to adjust the response and/or center frequency of the tunable RF filter. This adjustment may change the resonant frequency of for example tunable RF filter's resonator circuits to allow the passband to change in frequency and thus enable tuning over frequency bands. Moreover, this adjustment may also maintain a certain rejection (for example, suppression, attenuation, and/or the like) of the above-noted unwanted signals. However, this direct adjustment of the resonator circuit may, under certain conditions, be undesirable due to large voltage swings across the tuning components. The large, potentially harmful, voltage swings may also cause damage to certain types of active circuits, such as switches (for example, a switch or an active transistor based switch), at the filter.

In some example embodiments, a tunable RF filter may include a phase shifter coupled to the input of at least one resonator circuit.

In some example embodiments, rather than directly tune a variable capacitor and/or a variable inductor in at least one resonator circuit, the phase shifter may be tuned directly. The tuning of the phase shifter may shift the resonant frequency of at least one resonator circuit and thus allow the filter's passband (or for example, a location of a stopband, location of a zero) to change in frequency across frequency bands. Moreover, the zero in the rejection band (or stopband) may move such that the shape of the pass band (or stopband) filter may be maintained over the frequency sweep.

Figure 1A:
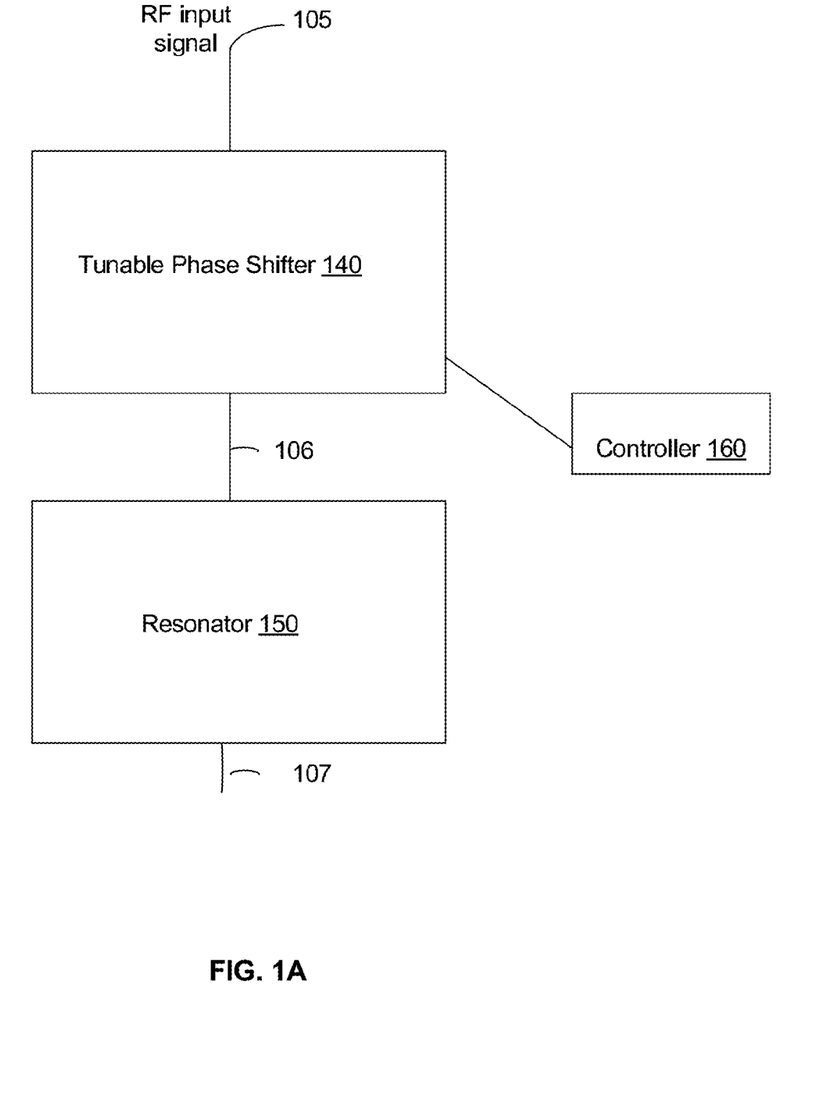
FIG. 1A depicts an example of a filter including a phase shifter, in accordance with some example embodiments.

FIG. 1A depicts an example tunable filter 100, in accordance with some example embodiments.

The tunable filter 100 may include at least one resonant circuit 150 coupled to a tunable phase shifter circuit 140. An RF signal input may enter the filter at 105, where it serves as an input to the phase shifter 140. The phase shifter 140 may be tuned directly by the controller 160 in order to tune the frequency of filter 100. By directly tuning phase shifter 140, the resonator circuit 150 may be tuned by the variable phase signal provided at 106, so the resonator can be for example fixed but tuned indirectly via the phase shifter in order to vary the frequency of filter 100. In some example embodiments, the resonator circuit 150 may be implemented as a fixed frequency resonator circuit without variable components. For example, the controller 160 may vary a variable capacitor and/or a variable inductor at the phase shifter 140 in order to shift the resonant frequency of the filter 100 across frequency bands without having to make any adjustments at the resonator circuit. In this way, filter 100 may be tuned across frequency bands.

In some example embodiments, the tunable phase shifter 140 may be implemented using a first technology, such as integrated passive device technology (IPD) for example (with any active circuits being implemented in for example silicon-on-insulator), while the resonator circuit 150 may be implemented using a second technology, such as surface acoustic (SAW), bulk acoustic wave (BAW), and/or the like technologies for example. When this is the case, directly tuning the phase shifter, rather than acoustic surface acoustic wave or bulk acoustic wave resonator circuits, can avoid some of the large voltage swings and/or Q factor issues noted above. In some example embodiments, the resonator circuit comprises a parallel resonator(s) 150, in which case the frequency tuned output would be obtained at 105 (and 107 would be at for example ground). In some example embodiments, the resonator circuit comprises a series resonator(s) 150, in which case the frequency tuned output would be obtained at 107.

Figure 1B:
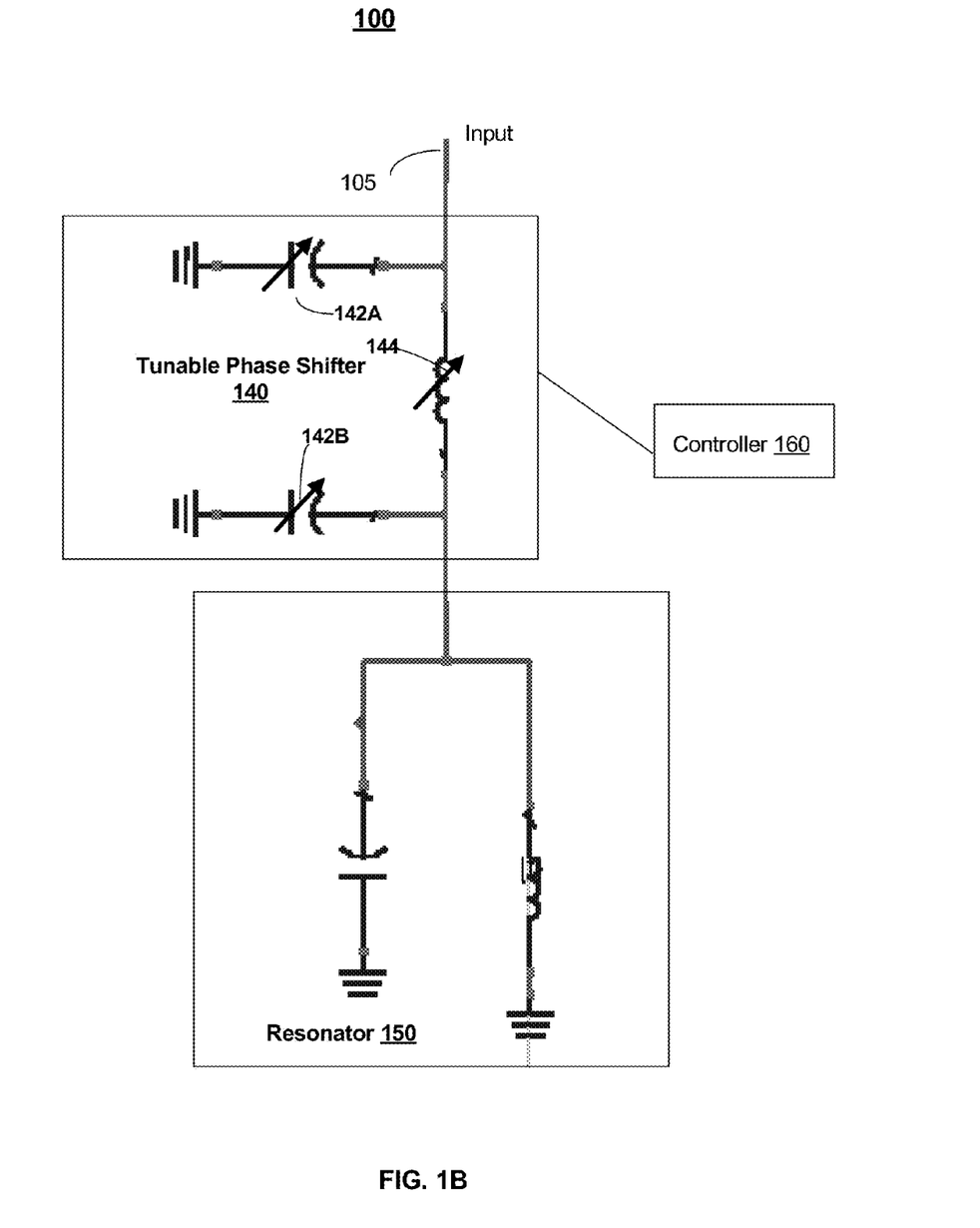
FIG. 1B depicts another example of a filter including a phase shifter, in accordance with some example embodiments.

FIG. 1B depicts filter 100 of FIG. 1A but includes an example of a phase shifter 140 and a resonator 150, in accordance with some example embodiments.

The phase shifter 140 may be tunable by varying capacitor 142A and/or 142B and/or by varying the inductor 144. For example, a capacitor bank at variable capacitor 142A may comprise a plurality of capacitors that can be switched in or out by controller 160 in order to vary capacitor 142A, although other types of variable capacitors or inductors may be used as well. By directly tuning the variable capacitor 142A, variable capacitor 142B, and/or variable inductor 144, the resonant frequency of the filter 100 can be varied without tuning the resonator 150 directly. To illustrate further, at resonance frequency, the insertion phase of a resonator may cross zero degrees. When we apply a phase shift to the resonator, the frequency at which the insertion phase crosses zero degrees changes, which indicates that the resonance frequency is also altered. In this way, the phase shifter can alter the resonant frequency of the resonator circuit. The phase shifter may be tuned as noted by varying an inductance and/or capacitance, although the phase may varied in other ways as well including for example having a delay line with a variable length (for example, switching in or out delay line segments).

Although FIG. 1B depicts variable elements at variable capacitor 142A, variable capacitor 142B and/or variable the inductor 144, some of the elements may not be variable. For example, phase shifter 140 may be implemented with variable capacitor at 142A, a variable capacitor at 142B and a fixed inductor at 144. Likewise, phase shifter 140 may be implemented with fixed capacitors at 142A-142B while inductor 144 may be variable.

Moreover, although FIG. 1B depicts the phase shifter 140 implemented as a pi ($\pi$) type phase shifting circuit, other types of phase shifters may be used as well including T-type circuits, transformer-based circuits, transmission line-based circuits, and/or other types of phase shifters.

In some example embodiments, the tunable phase shifter 140 may, as noted, be implemented with a first filtering technology such as integrated passive device technology, while the resonator circuit(s) may be implemented with fixed valued components using a second technology such as acoustic technologies including SAW, BAW, film bulk acoustic wave (FBAR), thin film bulk acoustic wave (TBAR), and/or the like. When this is the case, certain types of fixed resonators may be used as resonator 150 in the tunable filter 100, which would not otherwise be suitable for use in a tunable filter environment.

Although FIG. 1B depicts a shunt parallel LC resonator, the parallel LC resonator may be in series with the phase shifter as well. Although FIG. 1B depicts a single resonator, a plurality of resonators may be used as well.

FIG. 2A-2E depict examples of phase shifters 140, in accordance with some example embodiments.

Figure 2A:
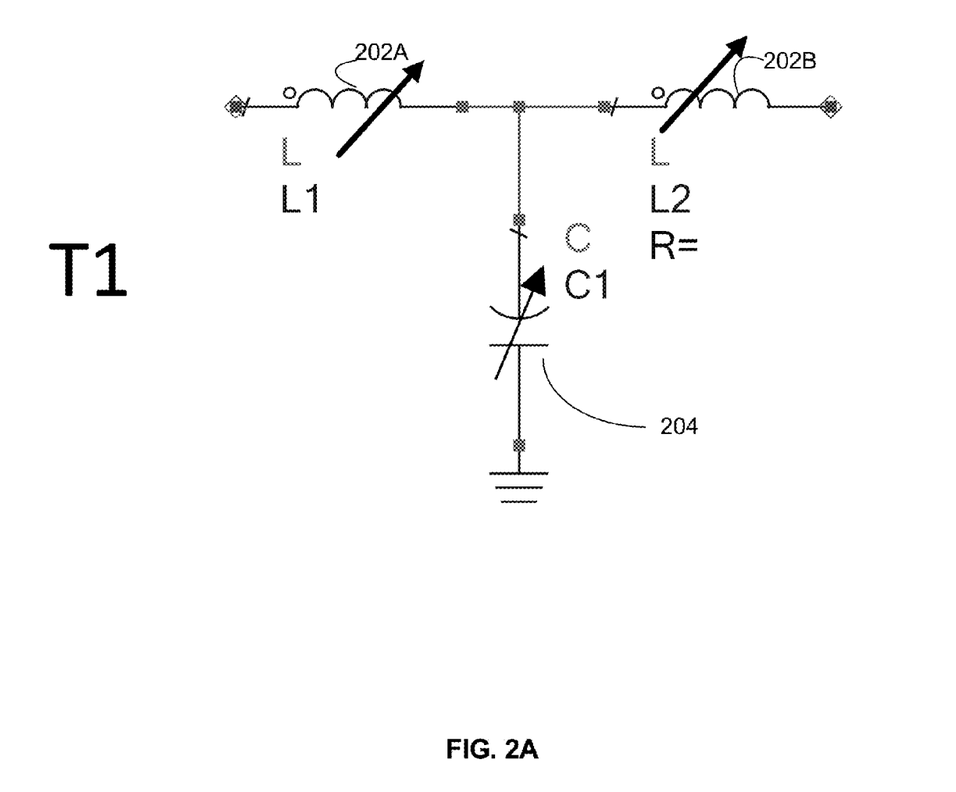
FIGS. 2A-2E depict examples of phase shifters, in accordance with some example embodiments.

FIG. 2A depicts an example of a T-type phase shifter including two inductors 202A-B and a variable capacitor 204, in accordance with some example embodiments. The first variable inductor 202A may be in series with the variable shunt capacitor 204 and the variable series inductor 202B. The phase shifter of FIG. 2A may be used when parallel resonators are configured at 150, although it may be used in other types of configurations as well. Although FIG. 2A depicts a certain variable components, some of the components may be fixed as well.

Figure 2B:
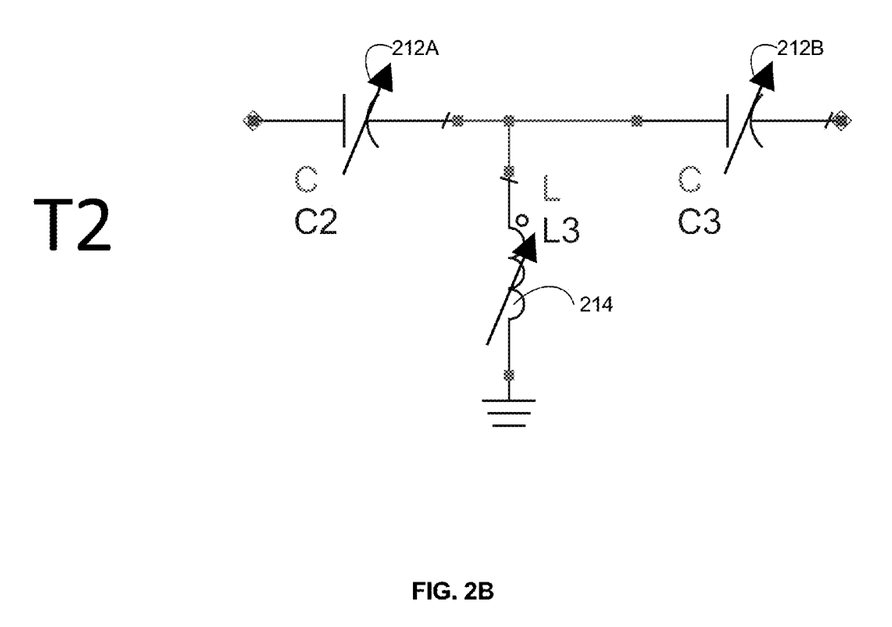

FIG. 2B depicts another example of a T-type phase shifter including two variable capacitors 212A-B and a variable inductor 214, in accordance with some example embodiments. The variable capacitor 212A may be in series with the shunt variable inductor 214 and the variable capacitor 212B. Although FIG. 2B depicts a certain variable components, some of the components may be fixed as well.

Figure 2C:
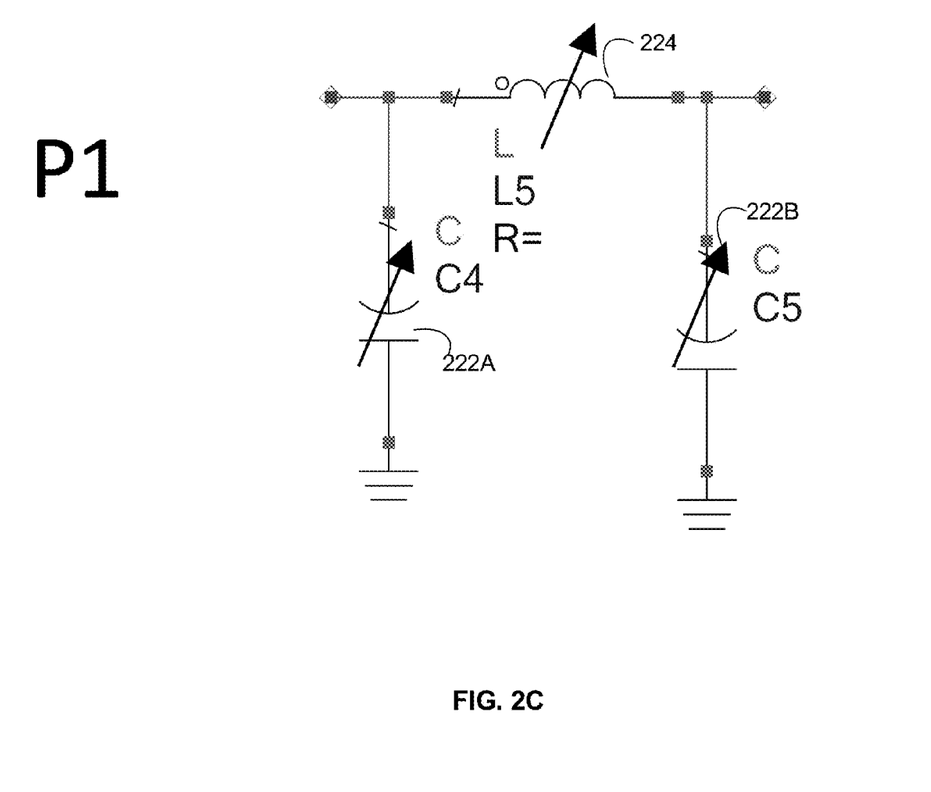

FIG. 2C depicts an example of a pi type phase shifter including two variable capacitors 222A-222B and a variable inductor 224, in accordance with some example embodiments. The variable shunt capacitor 222A may be in series with the variable inductor 224 and the shunt variable capacitor 222B. Although FIG. 2C depicts a certain variable components, some of the components may be fixed as well.

Figure 2D:
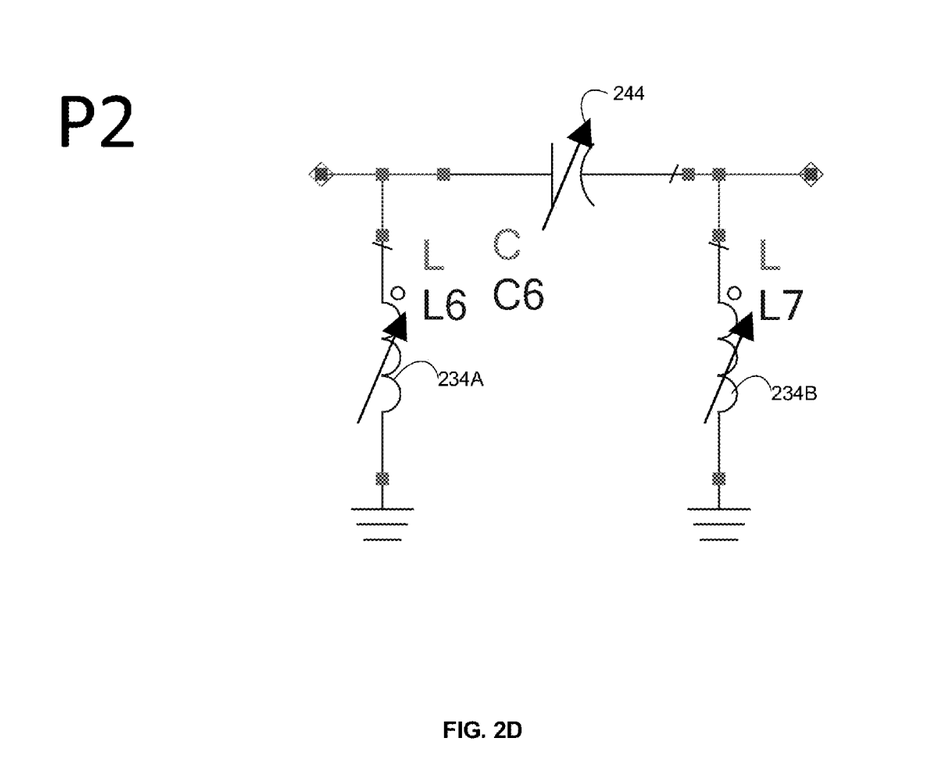

FIG. 2D depicts another example of a pi type phase shifter including two variable inductors 234A-234B and a variable capacitor 244, in accordance with some example embodiments. The variable shunt inductor 234A may be in series with the variable capacitor 244 and the shunt variable inductor 234B. The phase shifter of FIG. 2D may be used when series resonators are configured in 150, although it may be used in other types of configurations as well. Although FIG. 2D depicts a certain variable components, some of the components may be fixed as well.

Figure 2E:
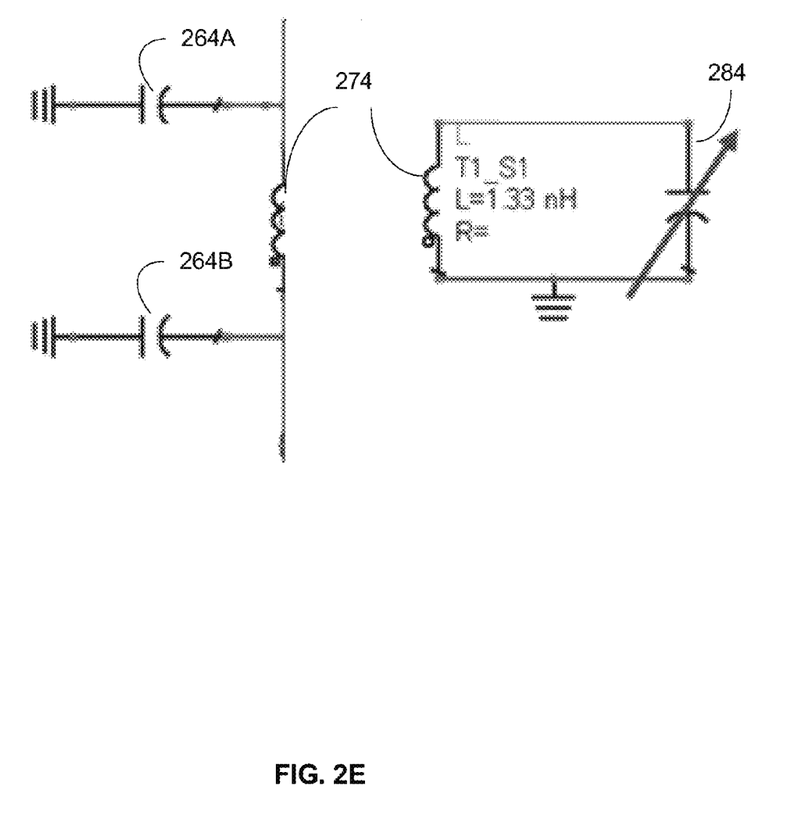

FIG. 2E depicts an example of phase shifter implemented using a transformer 274, in accordance with some example embodiments. The phase shifter includes a transformer 274 having an input capacitor 264A and an output capacitor 264B. Moreover, the variable capacitor 284 loads the secondary winding of the transformer. By loading the secondary winding with a capacitor, this may affect the phase of the voltage and current in the primary winding due to for example mutual coupling between the primary and secondary winding which may be present in a coupled inductor structure (also known as transformer), so that the phase shift is performed and the frequency of the resonator is shifted. In the example of FIG. 2E, the transformer's secondary inductor may be coupled to a tunable capacitive load 284 to enable tuning of the current phase shift at the transformer's primary inductor in order to provide the phase shift. Moreover, the transformer may provide an impedance transformation at the secondary winding that effectively down converts the voltage present at the primary winding to the secondary winding and hence reduce the possible high voltage swings at the secondary winding.

Figure 2F:
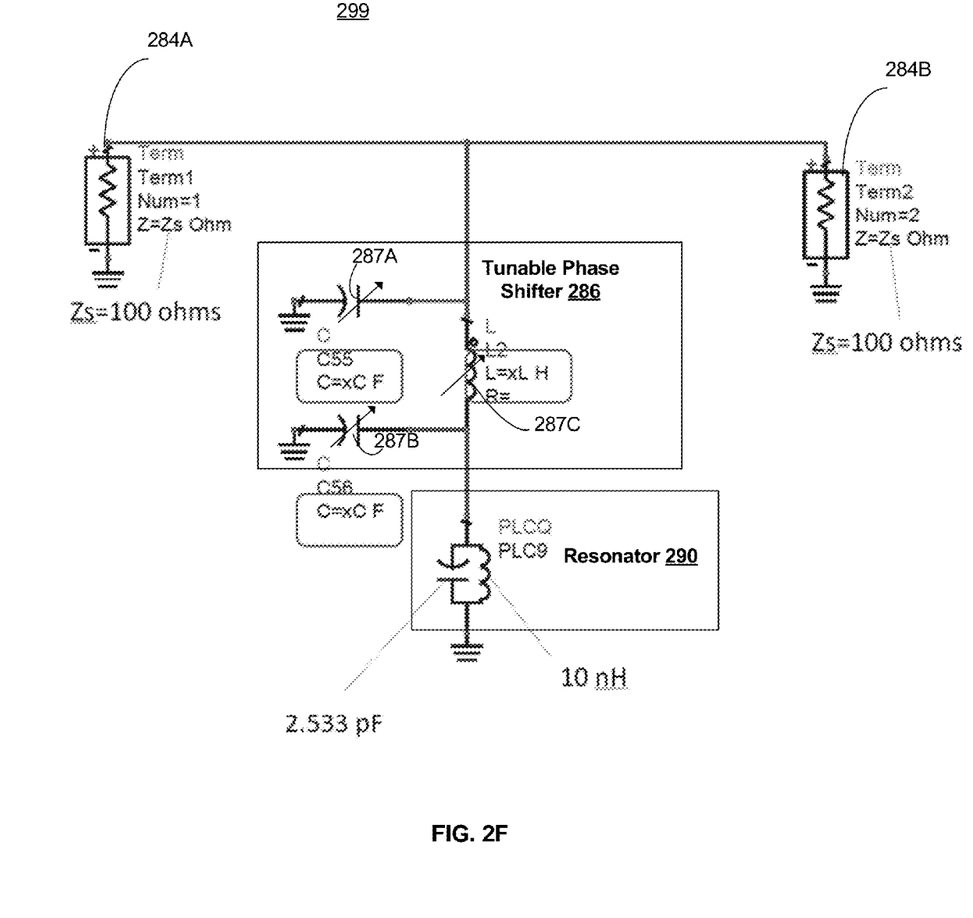
FIG. 2F depicts another example of a filter including a phase shifter, in accordance with some example embodiments.

FIG. 2F depicts a filter 299 including a phase shifter, in accordance with some example embodiments. Filter 299 is similar in some respect to filter 100 of FIG. 1B, but filter 299 depicts some example values for the components. In the example of FIG. 2F, the circuit 299 provides a parallel circuit implementation, so the input can be obtained at 284A and the output at 284B. The tunable phase shifter 286 may be coupled to the RF input 284A and the filter RF output 284B (which in this example have an impedance of 100 Ohms). Resonator circuit may include fixed value components, such as a capacitor at 2.533 picoFarads and an inductor having 10 nanoHenries.

The tunable phase shifter 286 may include tunable capacitors 287A-B and a tunable inductor 287C, although one or more of these components may be fixed as well. For example, the tunable capacitors 287A-B may be variable, but the inductor may be fixed 287C.

The tunable phase shifter 286 may vary the phase of the signal provided by to the resonator circuit 290. Varying the phase provided to resonator circuit 290 varies the overall fitter 299 center frequency. Table 1 below depicts how varying the values of the inductor 287C and capacitors 287A-B changes the effective resonant frequency of the filter 299. To illustrate, an inductor 287C value of 1.382 nanoHenries, a value of 0.278 picoFards at capacitor 287A, and a value of 0.278 picoFards at capacitor 287B, yields a phase shifter output that is offset by 10 degrees and results in an effective resonant frequency for filter 299 of 905 Mhz. By varying the inductance value to 3.979 nanoHenries and 0.853 picoFards at capacitors 287A and 287B, the phase shifter output that is offset by 30 degrees, yielding an effective resonant frequency for filter 299 of 766 MHz. In this way, the tuning of the phase shifter can vary the overall frequency response of filter 299.

TABLE 1

| | Phase shift at 1 GHz | | | | | | | | |
|---|---|---|---|---|---|---|---|---|---|
| | 0 degree | 10 degrees | 20 degrees | 30 degrees | 40 degrees | 50 degrees | 60 degrees | 70 degrees | 80 degrees |
| xL (nH) | ¯0 | 1.382 | 2.722 | 3.979 | 5.115 | 6.096 | 6.892 | 7.478 | 7.837 |
| xC (pF) | ¯0 | 0.278 | 0.561 | 0.853 | 1.159 | 1.484 | 1.838 | 2.229 | 2.671 |
| Effective resonance frequency | 1 GHz | 905 MHz | 830 MHz | 766 MHz | 711 MHz | 662 MHz | 618 MHz | 577 MHz | 539 MHz |

Although some of the examples described herein refer to a bandpass RF filter, such as one used at the RF front-end of the transmitter or receiver, the filter 100 may be used in other locations and may be implemented as other types of filters, such as low pass, bandpass, high pass, notch, bandstop, and/or combinations thereof.

Although the phase shifters depicted in FIG. 1A, 2A-E have a certain configuration, other types of phase shifters may be implemented as well. For example, the phase shifters may be implemented using transmission lines which can be varied to provide different amounts of phase shift.

To further illustrate, if filter 100 were configured to operate from 700 MHz to 900 MHz, the resonator 150 may be fixed at 900 MHz, in which case the phase shifter, such as the phase shifters at FIGS. 2A and 2C, may tune the resonant frequency down. On the other hand, if resonator 150 is fixed at 700 MHz for example, the phase shifter, such as the phase shifters at FIGS. 2B and 2D, may tune the resonant frequency up.

Figure 3:
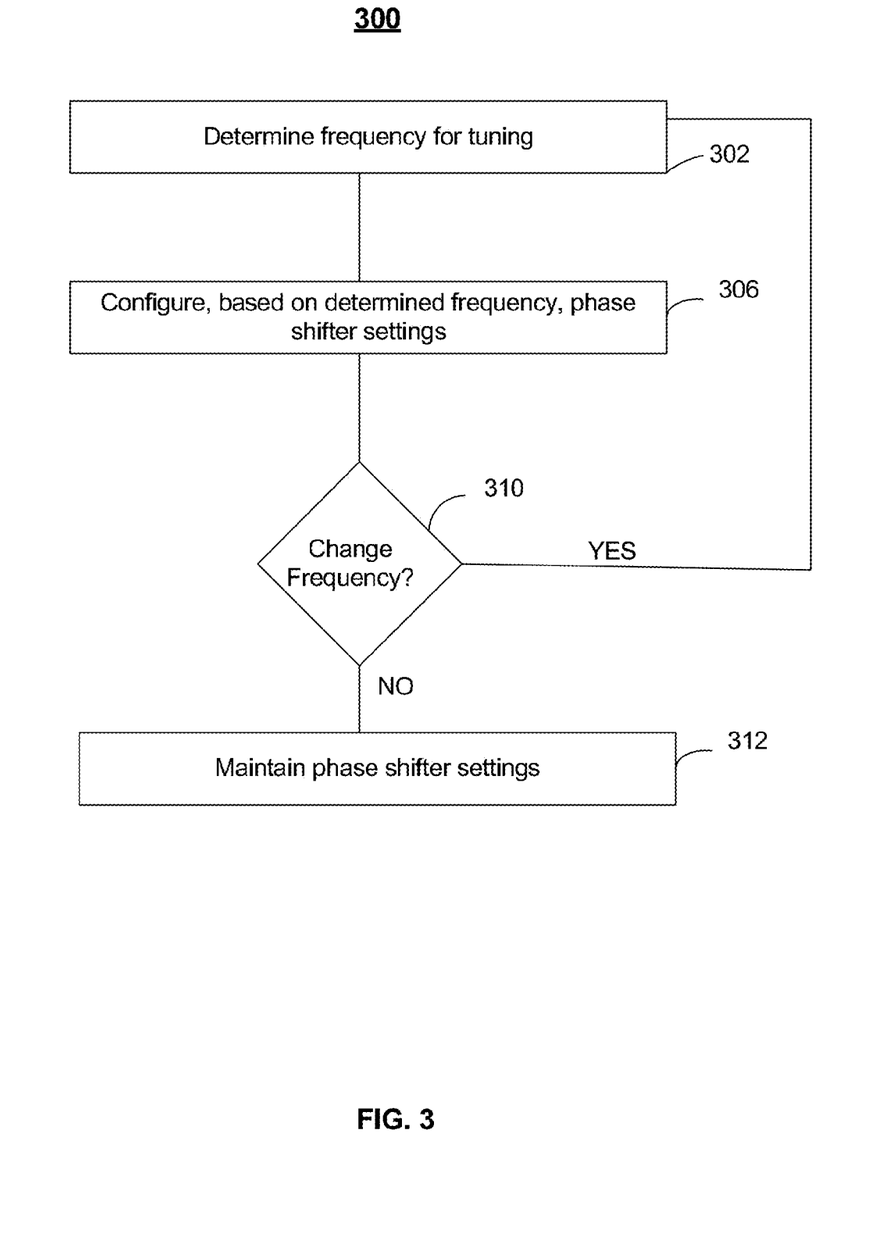
FIG. 3 depicts an example of a process for phase shifting the input to a resonator, in accordance with some example embodiments.

FIG. 3 depicts an example process 300 for directly tuning a phase shifter at a filter in order to tune the filter across the frequency spectrum, in accordance with some example embodiments. The description of FIG. 3 also refers to FIGS. 1A and 1B.

At 302, a frequency for filter 100 may be received, in accordance with some example embodiments. For example, a user equipment such as a cell phone, smart phone, tablet, or other wireless device may receive an indication of a frequency allocated to the user equipment by the network, such as a base station. If the user equipment is not transmitting (or receiving if the frequency is allocated for reception, for example) on the allocated frequency, the controller 160 at the user equipment may need to tune the filter 100 to the allocated frequency.

At 306, the phase shifter may be tuned to enable the filter 100 to have a passband at the frequency determined at 302, in accordance with some example embodiments. For example, the controller 160 may vary one or more variable components of the tunable phase shifter 140, such as capacitor 142A, capacitor 142B, and/or inductor 144. In some example embodiments, the frequency may be mapped to a setting for the variable component(s) at the phase shifter 140. For example, for a given passband, or center frequency for the filter 100, controller 160 may map (for example, via a look-up table, function, and/or the like) the frequency to a variable capacitor setting that provides the phase shift to be provided by phase shifter 140 to attain the desired passband/center frequency at filter <100. At 310, if the user equipment receives an allocated frequency change from the network (yes at 310, and 302), the process may repeat. However, if the user equipment remains on the allocated frequency, the controller 160 may maintain the phase shifter settings configured at 306 (no at 310 and 312).

Figure 4:
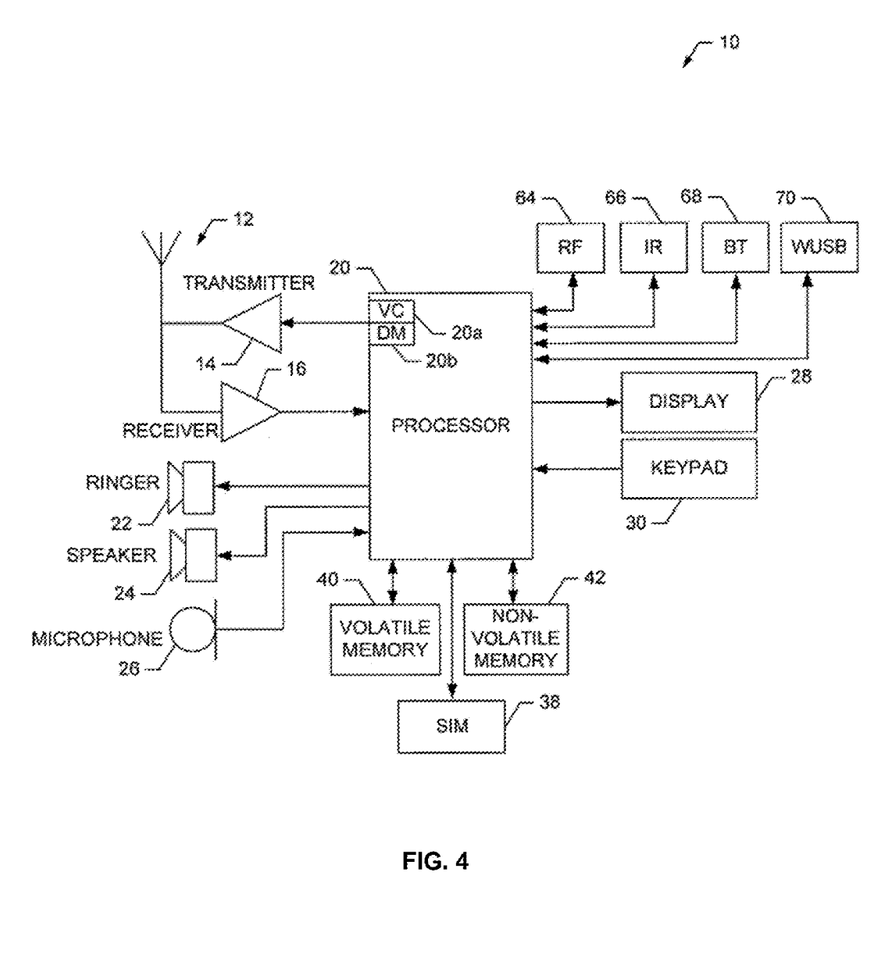
FIG. 4 depicts an example of an apparatus, in accordance with some example embodiments.

FIG. 4 depicts a block diagram of an apparatus 10 such as a user equipment, in accordance with some example embodiments. In some example embodiments, the tunable filter 100 disclosed may be implemented at receiver 16 and/or transmitter 14. For example, the tunable filter at transmitter 14 may be coupled to the output of a transmit amplifier and the output of the tunable filter may be coupled to antenna 12 to enable transmission of the filtered transmit signals. Likewise, tunable filter at receiver 16 may be coupled to antenna 12 to enable filtering of the receive signals.

The apparatus 10 may include at least one antenna 12 in communication with a transmitter 14 and a receiver 16. Alternatively transmit and receive antennas may be separate.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 4 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, fifth-generation (5G) communication protocols, Internet Protocol Multimedia Subsystem (IMS) communication protocols (for example, session initiation protocol (SIP) and/or any subsequent revisions or improvements to these standards. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced, LTE-Direct, LTE-Unlicensed, and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. For example, the PND may provide voice commands to enable voice-guided navigation. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 4, apparatus 10 may also include one or more mechanisms for sharing and/or obtaining data. The apparatus 10 may also include for example short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth™ (BT) transceiver 68 operating using Bluetooth™ wireless technology, a wireless universal serial bus (USB) transceiver 70, a Bluetooth™ Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), a eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus to provide the operations disclosed herein including process 300, and/or the like. The memories may comprise an identifier, such as an international mobile equipment identification (IMEI) code, capable of uniquely identifying apparatus 10. The functions may include the operations disclosed herein including the following: controlling the settings of a variable phase shifter to tune the frequency of an RF filter. In the example embodiment, the processor 20 may be configured using computer code stored at memory 40 and/or 42 to perform operations as disclosed herein with respect to process 300 and/or the like.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 4, computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing herein, a technical effect of one or more of the example embodiments disclosed herein may include filter tuning without tuning the actual resonator. Without in any way limiting the scope, interpretation, or application of the claims appearing herein, another technical effect of one or more of the example embodiments disclosed herein may include allowing for different technologies between parts of the filter. Without in any way limiting the scope, interpretation, or application of the claims appearing herein, another technical effect of one or more of the example embodiments disclosed herein may include the use of a wider array of resonators. Without in any way limiting the scope, interpretation, or application of the claims appearing herein, another technical effect of one or more of the example embodiments disclosed herein may include filter tuning having a smaller voltage swing across active circuit elements such as switches.

The subject matter described herein may be embodied in systems, apparatus, methods, and/or articles depending on the desired configuration. For example, the base stations and user equipment (or one or more components therein) and/or the processes described herein can be implemented using one or more of the following: a processor executing program code, an application-specific integrated circuit (ASIC), a digital signal processor (DSP), an embedded processor, a field programmable gate array (FPGA), and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "computer-readable medium" refers to any computer program product, machine-readable medium, computer-readable storage medium, apparatus and/or device (for example, magnetic discs, optical disks, memory, Programmable Logic Devices (PLDs))

used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. Moreover, the implementations described above may be directed to various combinations and subcombinations of the disclosed features and/or combinations and subcombinations of several further features disclosed above. Other embodiments may be within the scope of the following claims.

The different functions discussed herein may be performed in a different order and/or concurrently with each other. Furthermore, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments of the invention, these descriptions should not be viewed in a limiting sense. Rather, there are several variations and modifications, which may be made without departing from the scope of the present invention as, defined in the appended claims. The term "based on" includes "based on at least."

What is claimed:

1. An apparatus comprising:
   a tunable radio frequency filter comprising a tunable phase shifter coupled to a resonator,
   wherein the tunable phase shifter tunes a center frequency of the tunable radio frequency filter by at least varying a phase of a radio frequency signal provided to the resonator;
   a controller configured to at least:
      receive a frequency allocation from a base station, and
      vary, at the tunable phase shifter, at least a variable capacitor and/or a variable inductor to enable the varied phase, wherein the varied phase adjusts the center frequency of the tunable radio frequency filter.

2. The apparatus of claim 1, wherein the resonator comprises a fixed frequency resonator.

3. The apparatus of claim 2, wherein the fixed frequency resonator comprises at least one fixed capacitor and/or at least one fixed inductor.

4. The apparatus of claim 2, wherein the fixed frequency resonator comprises a surface acoustic wave resonator, a bulk acoustic wave resonator, a film bulk acoustic wave resonator, a ceramic filter, and/or a thin film bulk acoustic wave.

5. The apparatus of claim 1, wherein the tunable phase shifter comprises a pi-type phase shifting circuit, a T-type phase shifting circuit, and/or a transformer-based phase shifting circuit.

6. The apparatus of claim 1, wherein the varied phase adjusts the center frequency of the tunable radio frequency filter to a frequency within the frequency allocation.

7. The apparatus of claim 1, wherein the tunable phase shifter is implemented in a first technology, and wherein the resonator is implemented in a second technology.

8. The apparatus of claim 7, wherein the first technology comprises integrated passive device technology including active circuitry to enable tuning of the tunable phase shifter, and wherein the second technology comprises surface acoustic wave and/or bulk acoustic wave technology.

9. The apparatus of claim 1, wherein the tunable radio frequency filter comprises a tunable radio frequency bandpass filter, a radio frequency lowpass filter, a radio frequency highpass filter, a radio frequency notch filter, a radio frequency band stop filter, an intermediate filter frequency, a radio frequency front end filter, or any combination thereof.

10. The apparatus of claim 1, wherein the resonator comprises an acoustic resonator, wherein the tunable phase shifter includes an inductor implemented in integrated passive technology, and wherein the tunable phase shifter includes at least one variable capacitor including an active switch to vary the capacitance.

11. The apparatus of claim 1, wherein the tunable phase shifter includes an input and an output, wherein the input receives the radio frequency signal, and wherein the output provides, to the resonator, a phase shifted radio frequency signal causing a change in a resonant frequency of the resonator.

12. A method comprising:
   receiving, at a tunable radio frequency filter, an input signal, wherein the tunable radio frequency filter includes a tunable phase shifter coupled to a resonator; and
   varying, at the tunable phase shifter, a phase of a radio frequency signal provided to the resonator in order to at least tune a center frequency of the tunable radio frequency filter, wherein the varying further comprises receiving, by a controller, a frequency allocation from a base station, and varying, at the tunable phase shifter, at least a variable capacitor and/or a variable inductor to enable the varied phase, wherein the varied phase adjusts the center frequency of the tunable radio frequency filter.

13. The method of claim 12, wherein the varied phase adjusts the center frequency of the tunable radio frequency filter to a frequency within the frequency allocation.

14. The method of claim 12, wherein the resonator comprises a fixed frequency resonator.

15. The method of claim 14, wherein the fixed frequency resonator comprises at least one fixed capacitor and/or at least one fixed inductor.

16. The method of claim 14, wherein the fixed frequency resonator comprises a surface acoustic wave resonator, a bulk acoustic wave resonator, a film bulk acoustic wave resonator, a ceramic filter, and/or a thin film bulk acoustic wave.

17. The method of claim 12, wherein the tunable phase shifter comprises a pi-type phase shifting circuit, a T-type phase shifting circuit, and/or a transformer-based phase shifting circuit.

18. The method of claim 12, wherein the tunable phase shifter is implemented in a first technology, and wherein the resonator is implemented in a second technology.

19. The method of claim 18, wherein the first technology comprises integrated passive device technology including active circuitry to enable tuning of the tunable phase shifter, and wherein the second technology comprises surface acoustic wave and/or bulk acoustic wave technology.

* * * * *